(12) United States Patent
Zhang et al.

(10) Patent No.: US 7,522,064 B2
(45) Date of Patent: Apr. 21, 2009

(54) APPARATUS AND METHODS FOR TESTING THE LIFE OF A LEAKAGE CURRENT PROTECTION DEVICE

(75) Inventors: Feng Zhang, Shanghai (CN); Hongliang Chen, Shanghai (CN); Fu Wang, Yueqing Zhejiang (CN); Wusheng Chen, Yueqing Zhejiang (CN); Yulin Zhang, Shanghai (CN); Huaiyin Song, Yueqing Zhejiang (CN)

(73) Assignee: General Protecht Group, Inc., Zhejiang (CN)

( * ) Notice: Subject to any disclaimer, the term of this patent is extended or adjusted under 35 U.S.C. 154(b) by 278 days.

(21) Appl. No.: 11/588,016

(22) Filed: Oct. 26, 2006

(65) Prior Publication Data

US 2007/0146944 A1 Jun. 28, 2007

(30) Foreign Application Priority Data

Dec. 27, 2005 (CN) .................. 2005 1 0132844

(51) Int. Cl.
*G08B 21/00* (2006.01)
(52) U.S. Cl. ..................................... 340/638
(58) Field of Classification Search ................ 340/638, 340/635, 653, 657, 384.1; 361/42; 324/500
See application file for complete search history.

(56) References Cited

U.S. PATENT DOCUMENTS

| | | | |
|---|---|---|---|
| 4,931,894 A | 6/1990 | Legatti | |
| 4,979,070 A | 12/1990 | Bodkin | |
| 5,053,931 A | 10/1991 | Rushing | |
| 5,063,516 A * | 11/1991 | Jamoua et al. | 701/114 |
| 5,223,810 A | 6/1993 | Van Haaren | |
| 5,229,730 A | 7/1993 | Legatti et al. | |
| 5,334,939 A | 8/1994 | Yarbrough | |
| 5,363,269 A | 11/1994 | McDonald | |
| 5,418,678 A | 5/1995 | McDonald | |
| 5,448,443 A | 9/1995 | Muelleman | |
| 5,477,412 A | 12/1995 | Neiger et al. | |
| 5,541,800 A | 7/1996 | Misencik | |
| 5,642,248 A | 6/1997 | Campolo et al. | |
| 5,654,857 A | 8/1997 | Gershen | |
| 5,661,623 A | 8/1997 | McDonald et al. | |
| 5,673,360 A | 9/1997 | Scripps | |
| 5,684,272 A | 11/1997 | Gernhardt et al. | |
| 5,706,155 A | 1/1998 | Neiger et al. | |
| 5,729,417 A | 3/1998 | Neiger et al. | |
| 5,757,598 A | 5/1998 | Aromin | |
| 5,786,971 A | 7/1998 | Chan et al. | |

(Continued)

*Primary Examiner*—Phung Nguyen
(74) *Attorney, Agent, or Firm*—Morris Manning Martin LLP; Tim Tingkang Xia, Esq.

(57) ABSTRACT

An apparatus for testing the life of a leakage current protection device, comprising a microcontroller unit, at least one of a first fault detector and a second fault detector, at least one of an audio alarm and a visual alarm, a power supply circuit. In operation, the first fault detector and/or the second fault detector receive at least one signal from the leakage current protection device, and generate at least one DC voltage corresponding to the at least one signal to be received by the MCU. The MCU compares the at least one DC voltage with a predetermined threshold value to determine whether a fault exists in the leakage current protection device, and activates the alarm circuit if at least one fault exists.

20 Claims, 6 Drawing Sheets

U.S. PATENT DOCUMENTS

| | | | | |
|---|---|---|---|---|
| 5,825,599 | A | 10/1998 | Rosenbaum | |
| 5,841,615 | A | 11/1998 | Gershen | |
| 5,899,761 | A | 5/1999 | Crane et al. | |
| 5,906,517 | A | 5/1999 | Crane et al. | |
| 5,963,406 | A | 10/1999 | Neiger et al. | |
| 5,963,408 | A | 10/1999 | Neiger et al. | |
| 6,021,034 | A | 2/2000 | Chan et al. | |
| 6,040,967 | A | 3/2000 | DiSalvo | |
| 6,052,265 | A | 4/2000 | Zaretsky et al. | |
| 6,052,266 | A | 4/2000 | Aromin | |
| 6,128,169 | A | 10/2000 | Neiger et al. | |
| 6,147,617 | A * | 11/2000 | Kim | 340/664 |
| 6,226,161 | B1 | 5/2001 | Neiger et al. | |
| 6,246,558 | B1 | 6/2001 | DiSalvo et al. | |
| 6,252,407 | B1 | 6/2001 | Gershen | |
| 6,259,340 | B1 | 7/2001 | Fuhr et al. | |
| 6,262,871 | B1 | 7/2001 | Nemir et al. | |
| 6,282,070 | B1 | 8/2001 | Ziegler et al. | |
| 6,292,337 | B1 | 9/2001 | Legatti et al. | |
| 6,339,525 | B1 | 1/2002 | Neiger et al. | |
| 6,381,112 | B1 | 4/2002 | DiSalvo | |
| 6,381,113 | B1 * | 4/2002 | Legatti | 361/46 |
| 6,407,469 | B1 | 6/2002 | Cline et al. | |
| 6,407,893 | B1 | 6/2002 | Neiger et al. | |
| 6,433,555 | B1 | 8/2002 | Leopold et al. | |
| 6,437,700 | B1 | 8/2002 | Herzfeld et al. | |
| 6,437,953 | B2 | 8/2002 | DiSalvo et al. | |
| 6,437,955 | B1 | 8/2002 | Duffy et al. | |
| 6,442,007 | B1 | 8/2002 | Li | |
| 6,465,735 | B2 | 10/2002 | May | |
| 6,515,564 | B2 | 2/2003 | Leopold et al. | |
| 6,532,139 | B2 | 3/2003 | Kim et al. | |
| 6,538,862 | B1 | 3/2003 | Mason, Jr. et al. | |
| 6,540,533 | B1 | 4/2003 | Schreiber | |
| 6,577,478 | B2 | 6/2003 | Kim et al. | |
| 6,611,406 | B2 | 8/2003 | Neiger et al. | |
| 6,643,108 | B2 | 11/2003 | Cline et al. | |
| 6,646,838 | B2 | 11/2003 | Ziegler et al. | |
| 6,657,834 | B2 | 12/2003 | DiSalvo | |
| 6,671,145 | B2 * | 12/2003 | Germain et al. | 361/45 |
| 6,697,238 | B2 | 2/2004 | Bonilla et al. | |
| 6,724,589 | B1 | 4/2004 | Funderburk | |
| 6,734,680 | B1 | 5/2004 | Conard | |
| 6,734,769 | B1 | 5/2004 | Germain et al. | |
| 6,747,367 | B2 | 6/2004 | Cline et al. | |
| 6,771,152 | B2 | 8/2004 | Germain et al. | |
| 6,788,504 | B2 | 9/2004 | Vanderkolk | |
| 6,813,126 | B2 | 11/2004 | DiSalvo et al. | |
| 6,828,886 | B2 | 12/2004 | Germain et al. | |
| 6,850,394 | B2 | 2/2005 | Kim | |
| 6,859,044 | B2 | 2/2005 | Hughes | |
| 6,864,766 | B2 | 3/2005 | DiSalvo et al. | |
| 6,867,954 | B2 | 3/2005 | Wu et al. | |
| 6,873,231 | B2 | 3/2005 | Germain et al. | |
| 6,897,381 | B2 | 5/2005 | He et al. | |
| 6,915,992 | B1 | 7/2005 | Gretz | |
| 6,944,001 | B2 | 9/2005 | Ziegler et al. | |
| 6,946,935 | B2 | 9/2005 | Wu et al. | |
| 6,949,994 | B2 | 9/2005 | Germain et al. | |
| 6,949,995 | B2 | 9/2005 | Leopold et al. | |
| 6,954,125 | B2 | 10/2005 | Wu et al. | |
| 6,958,463 | B1 | 10/2005 | Kochman et al. | |
| 6,963,260 | B2 | 11/2005 | Germain et al. | |
| 6,972,572 | B2 | 12/2005 | Mernyk et al. | |
| 6,975,492 | B2 | 12/2005 | DiSalvo | |
| 6,982,856 | B2 | 1/2006 | Bernstein | |
| 6,991,495 | B1 | 1/2006 | Aromin | |
| 7,256,701 | B2 * | 8/2007 | Kono et al. | 340/648 |
| 2004/0037018 | A1 * | 2/2004 | Kim | 361/42 |
| 2004/0070899 | A1 * | 4/2004 | Gershen et al. | 361/42 |
| 2006/0198066 | A1 | 9/2006 | Chen et al. | |

\* cited by examiner

APPARATUS AND METHODS FOR TESTING THE LIFE OF A LEAKAGE CURRENT PROTECTION DEVICE

CROSS-REFERENCE TO RELATED APPLICATION

This application claims priority of Chinese Patent Application No. 200510132844.2, filed on Dec. 27, 2005, entitled "Intelligent Life Testing Methods and Apparatus for Leakage Current Protection Device" by Feng ZHANG, Hongliang CHEN, Fu WANG, Wusheng CHEN, Yulin ZHANG and Huaiyin SONG, the disclosure of which is incorporated herein by reference in its entirety.

This application is related to four co-pending U.S. patent applications, entitled "Intelligent Life Testing Methods and Apparatus for Leakage Current Protection Device with Indicating Means," by Feng ZHANG, Hongliang CHEN, Fu WANG, Wusheng CHEN, Yulin ZHANG and Huaiyin SONG, Ser. No. 11/588,017; "Intelligent Life Testing Methods and Apparatus for Leakage Current Protection," by Feng ZHANG, Hongliang CHEN, Fu WANG, Wusheng CHEN, Yulin ZHANG and Huaiyin SONG; Ser. No. 11/588,163; "Intelligent Life Testing Methods and Apparatus for Leakage Current Protection," by Wusheng CHEN, Fu WANG, and Lianyun WANG, Ser. No. 11/588,046; and "Intelligent Life Testing Methods and Apparatus for Leakage Current Protection," by Feng ZHANG, Hongliang CHEN, Fu WANG, Wusheng CHEN, Yulin ZHANG and Huaiyin SONG, Ser. No. 11/588,048, respectively. The above identified co-pending applications were filed on the same day that this application was filed, and with the same assignee as that of this application. The disclosures of the above identified co-pending applications are incorporated herein by reference in their entireties.

FIELD OF THE PRESENT INVENTION

The present invention generally relates to real time detection of fault of a leakage current protection device. More particularly, the present invention relates to apparatus and methods for testing the life of a leakage current protection device.

BACKGROUND OF THE PRESENT INVENTION

Leakage current protection can be divided into two categories according to their functionalities: ground fault circuit interrupter (hereinafter "GFCI") and arc fault circuit interrupter (hereinafter "AFCI"). In order to achieve the goal of leakage current protection, a leakage current protection device used for appliances comprises at least two components: a trip mechanism and a leakage current detection circuit. The trip mechanism comprises a silicon controlled rectifier (hereinafter "SCR"), trip coil, and trip circuit interrupter device. The leakage current detection circuit comprises induction coils, a signal amplifier and a controller.

The operating principle of a GFCI used for appliances is as follows. In a normal condition, the electric current on a hot wire of an electrical socket should be the same as the electric current on a neutral wire in the same electrical socket. When a leakage current occurs, there exists a current differential between the hot wire and the neutral wire of the electrical socket. The inductive coil of the leakage current protection device monitors the current differential and transfers the current differential into a voltage signal. The voltage signal is then amplified by the signal amplifier and sent to the controller. If the current differential exceeds a predetermined threshold, the controller sends a control signal to the trip circuit interrupter to cut off the connection between the AC power and the appliance to prevent damage caused by the leakage current.

For an AFCI used for appliances, in a normal condition, the electric current on a hot wire of an electrical socket should be the same as the electric current on a neutral wire in the same electrical socket, and the variation of both the electric current is same. When an arc fault occurs due to aging or damages of the AFCI device, the current or voltage between the hot wire and the neutral wire of the electrical socket exhibits a series of repeated pulse signals. The inductive coil of the arc fault protection device detects the pulse signals and converts the pulse signals to a voltage signal. The voltage signal is amplified by the signal amplifier and sent to the controller. If the amplitude of the pulse signals or the their occurring frequency exceed certain predetermined threshold, the controller sends a control signal to the trip circuit interrupter to cut off the connection between the AC power and the appliance to prevent further damage caused by the arc fault.

Leakage current protection devices have been widespreadly used because of their superior performance. However, the leakage protection devices may fail to provide such leakage current protection, if they are installed improperly and/or they are damaged due to aging. If a faulty controller can not output a correct control signal, or a trip mechanism fails to cut off the connection between the AC power and the appliance, the leakage current protection device will not be able to provide the leakage current protection, which may cause further damages or accidents. Although most leakage current protection devices are equipped with a manual testing button, usually, users seldom use the manual testing button. Therefore, the leakage current protection devices need an additional circuit to automatically detect malfunctions, faults or the end of the life of such devices. The great relevance would be gained if a leakage current protection device is capable of automatically detecting a fault therein or its end of the life, and consequently alerting a user to take an appropriate action including repairing or replacing the leakage current detection circuit.

Therefore, a heretofore unaddressed need exists in the art to address the aforementioned deficiencies and inadequacies.

SUMMARY OF THE PRESENT INVENTION

In one aspect, the present invention relates to an apparatus for testing the life of a leakage current protection device. The leakage current protection device has a first input, a second input, a third input, a first output, a second output, a third output, a self-sustained oscillation circuit that is electro-magnetically coupled therebetween the first input and the second input, and electrically coupled to the third output, a reset circuit with an input that is electrically coupled to the third input, and an output that is electrically coupled to the first output, and a trip coil circuit with an input that is electrically coupled to the output of the reset circuit and the first output, and an output that is electrically coupled to the second output. In one embodiment, the apparatus comprises: (i) a microcontroller unit (MCU), (ii) a fault detection circuit, (iii) an alarm circuit, and (iv) a power supply circuit.

The MCU has a first input, a second input, a first output that is electrically coupled to the third input of the leakage current protection device, a second output, and a power supply input. The fault detection circuit has an first input that is electrically coupled to the second output of the leakage current protection device, a second input that is electronically coupled to the third output of the leakage current protection device, a first output that is electrically coupled to the first input of the MCU, and a second output that is electrically coupled to the second input of the MCU, respectively. The alarm circuit has an input that is electrically coupled to the second output of the MCU, and a power supply input. The power supply circuit has an input that is electrically coupled to the first output of the leakage current protection device, and an output that is electrically coupled to the power supply input of the MCU and the power supply input of the alarm circuit.

When this apparatus is in operation, the fault detection circuit receives at least one signal from the second output and the third output of the leakage current protection device, and generates at least one DC voltage corresponding to the at least one signal. The at least one DC voltage is received by at least one of the first input and second input of the MCU. The MCU compares the at least one DC voltage with a predetermined threshold value to determine whether a fault exists in the leakage current protection device. The alarm circuit is activated if at least one fault exists.

In one embodiment, the fault detection circuit has at least one of a first fault detector electrically coupled to the self-sustained oscillation circuit and a second fault detector electrically coupled to the trip coil circuit.

The first fault detector has a coupling and frequency selective processing circuit. The coupling and frequency selective processing circuit receives an oscillation signal generated by the self-sustained oscillation circuit, filters the oscillation signal, converts the filtered oscillation signal into a first DC voltage, and provides the first DC voltage to the second input of the MCU. The MCU is programmed such that if the first DC voltage is greater than a first predetermined threshold value, no fault exists in the leakage current protection device, and if the first DC voltage is less than the first predetermined threshold value, at least one fault exists in the leakage current protection device.

The second fault detector comprises: (i) a power grid signal synchronization monitoring circuit, (ii) a trip circuit detection circuit. The power grid signal synchronization monitoring circuit generates a series of pulse signal that is synchronized with an AC power source grid. The trip circuit detection circuit receives and sends the series of pulse signal to a switching device, which has an anode, a gate, and a cathode. The series of pulse signal sets the switching device into a conductive state during the period when the voltage of the pulse signal is high. A second DC voltage is measured between the gate and the cathode of the switching device while the switching device is in the conductive state. The second DC voltage is electrically coupled to the first input of the MCU. The MCU is programmed such that if the second DC voltage is greater than a second predetermined threshold value, no fault exists in the trip coil circuit of the leakage current protection device, and if the second DC voltage is less than the second predetermined threshold value, at least one fault exists in the leakage current protection device.

If the MCU determines that at least one fault exists, the MCU sends an alarm signal to the alarm circuit. The alarm circuit receives the alarm signal and generates an alarm. The alarm circuit comprises at least one of an audio alarm circuit for generating an audible alarm and a visual alarm circuit for generating a visible alarm.

In another aspect, the present invention relates to a method for testing the life of a leakage current protection device. The leakage current protection device has a first input, a second input, a third input, a first output, a second output, a third output, a self-sustained oscillation circuit that is electro-magnetically coupled therebetween the first input and the second input, and electrically coupled to the third output, a reset circuit with an input that is electrically coupled to the third input, and an output that is electrically coupled to the first output, and a trip coil circuit with an input that is electrically coupled to the output of the reset circuit and the first output, and an output that is electrically coupled to the second output. In one embodiment, the method comprises the step of: (i) providing a testing device. This testing device has (1) a microcontroller unit (MCU) that has a first input, a second input, a first output that is electrically coupled to the third input of the leakage current protection device, a second output, and a power supply input, (2) a fault detection circuit that has an first input that is electrically coupled to the second output of the leakage current protection device, a second input that is electronically coupled to the third output of the leakage current protection device, a first output that is electrically coupled to the first input of the MCU, and a second output that is electrically coupled to the second input of the MCU, respectively, (3) an alarm circuit that has an input that is electrically coupled to the second output of the MCU, and a power supply input, and (4) a power supply circuit that has an input that is electrically coupled to the first output of the leakage current protection device, and an output that is electrically coupled to the power supply input of the MCU and the alarm circuit.

The method further comprises the steps of: (ii) processing at least one signal from the second output and the third output of the leakage current protection device and providing at least one DC voltage to be received at least one of the first input and the second input of the MCU, (iii) comparing the value of the DC voltage to a predetermined threshold value by the MCU to determine whether a fault exists in the leakage current protection device, (iv) activating the alarm circuit by the MCU if a fault exists in the leakage current protection device to generate an alarm to alert users of the leakage current protection device. The MCU is programmed such that if the DC voltage is greater than the predetermined threshold value, no fault exists in the leakage current protection device, and if the DC voltage is less than the predetermined threshold value, a fault exists in the leakage current protection device.

In one embodiment, the processing signal step further comprises the steps of: (i) receiving a oscillation signal generated by a self-sustained oscillation circuit which reflects the intrinsic frequency characteristics of the leakage current detection circuit, (ii) filtering the oscillation signal by a coupling and frequency selective processing circuit, (iii) converting the filtered oscillation signal into a first DC voltage, and (iv) providing the first DC voltage to the second input of the MCU.

In another embodiment, the processing signal step further comprises the steps of: (i) generating a series of pulse signal that is synchronized with an AC power source grid by a power grid signal synchronization monitoring circuit, (ii) receiving and sending the series of pulse signal to a switching device which has a anode, a cathode and a gate, by a trip circuit detection circuit, (iii) setting the switching device in a conductive state during the period when the voltage of the pulse signal is high, (iv) detecting a second DC voltage across the gate and the cathode of the switching device, while the switching device is in a conductive state, and (v) providing the second DC voltage to the first input of the MCU.

The activating the alarm circuit step of the method further includes at least of one of following steps: (i) activating an audio alarm circuit for generating an audible alarm, and (ii) activating a visual alarm circuit for generating a visible alarm.

In yet another aspect, the present invention relates to a leakage current protection device with life testing capacity. In one embodiment, the leakage current protection device with life testing capacity includes (i) a leakage current protection device, (ii) a microcontroller unit (MCU), (iii) a fault detection circuit, (iv) an alarm circuit, and (v) a power supply circuit.

In one embodiment, the leakage current protection device has a first, second and third input, a first, second and third output, a self-sustained oscillation circuit that is electro-magnetically coupled therebetween the first input and the second input, and electrically coupled to the third output, a reset circuit with an input that is electrically coupled to the third input, and an output that is electrically coupled to the first output, and a trip coil circuit with an input that is electrically coupled to the output of the reset circuit and the first output, and an output that is electrically coupled to the second output.

In one embodiment, the MCU has a first input, a second input, a first output that is electrically coupled to the third input of the leakage current protection device, a second output, and a power supply input. The fault detection circuit has an first input that is electrically coupled to the second output of the leakage current protection device, a second input that is electronically coupled to the third output of the leakage current protection device, a first output that is electrically coupled to the first input of the MCU, and a second output that is electrically coupled to the second input of the MCU, respectively. The alarm circuit has an input that is electrically coupled to the second output of the MCU, and a power supply input. The power supply circuit has an input that is electrically coupled to the first output of the leakage current protection device, and an output that is electrically coupled to the power supply input of the MCU and the alarm circuit.

When this device is in operation, the fault detection circuit receives at least one signal from the second output and the third output of the leakage current protection device, and generates at least one DC voltage corresponding to the at least one signal. The at least one DC voltage is received by at least one of the first input and second input of the MCU. The MCU compares the at least one DC voltage with a predetermined threshold value to determine whether a fault exists in the leakage current protection device. The alarm circuit is activated if at least one fault exists.

In one embodiment, the fault detection circuit includes at least one of a first fault detector electrically coupled to the self-sustained oscillation circuit and a second fault detector electrically coupled to the trip coil circuit.

The first fault detector has a coupling and frequency selective processing circuit. The coupling and frequency selective processing circuit receives an oscillation signal generated by the self-sustained oscillation circuit, filters the oscillation signal, converts the filtered oscillation signal into a second DC voltage, and provides the second DC voltage to the second input of the MCU. The MCU is programmed such that if the second DC voltage is greater than a second predetermined threshold value, no fault exists in the leakage current protection device, and if the second DC voltage is less than the second predetermined threshold value, at least one fault exists in the leakage current protection device.

The second fault detector has: (i) a power grid signal synchronization monitoring circuit, (ii) a trip circuit detection circuit. The power grid signal synchronization monitoring circuit generates a series of pulse signal that is synchronized with an AC power source grid. The trip circuit detection circuit receives and sends the series of pulse signal to a switching device, which has an anode, a gate, and a cathode. The series of pulse signal sets the switching device into a conductive state during the period when the voltage of the pulse signal is high. A first DC voltage is measured between the gate and the cathode of the switching device while the switching device is in the conductive state. The first DC voltage is electrically coupled to the first input of the MCU. The MCU is programmed such that if the first DC voltage is greater than a first predetermined threshold value, no fault exists in the trip coil circuit of the leakage current protection device, and if the first DC voltage is less than the first predetermined threshold value, at least one fault exists in the leakage current protection device.

If the MCU determines that at least one fault exists, the MCU sends an alarm signal to the alarm circuit. The alarm circuit receives the alarm signal and generates an alarm. The alarm circuit includes at least one of an audio alarm circuit for generating an audible alarm and a visual alarm circuit for generating a visible alarm.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

Further features and benefits of the present invention will be apparent from a detailed description of preferred embodiments thereof taken in conjunction with the following drawings, wherein similar elements are referred to with similar reference numbers, and wherein.

DETAILED DESCRIPTION OF THE PRESENT INVENTION

Figure 1A:
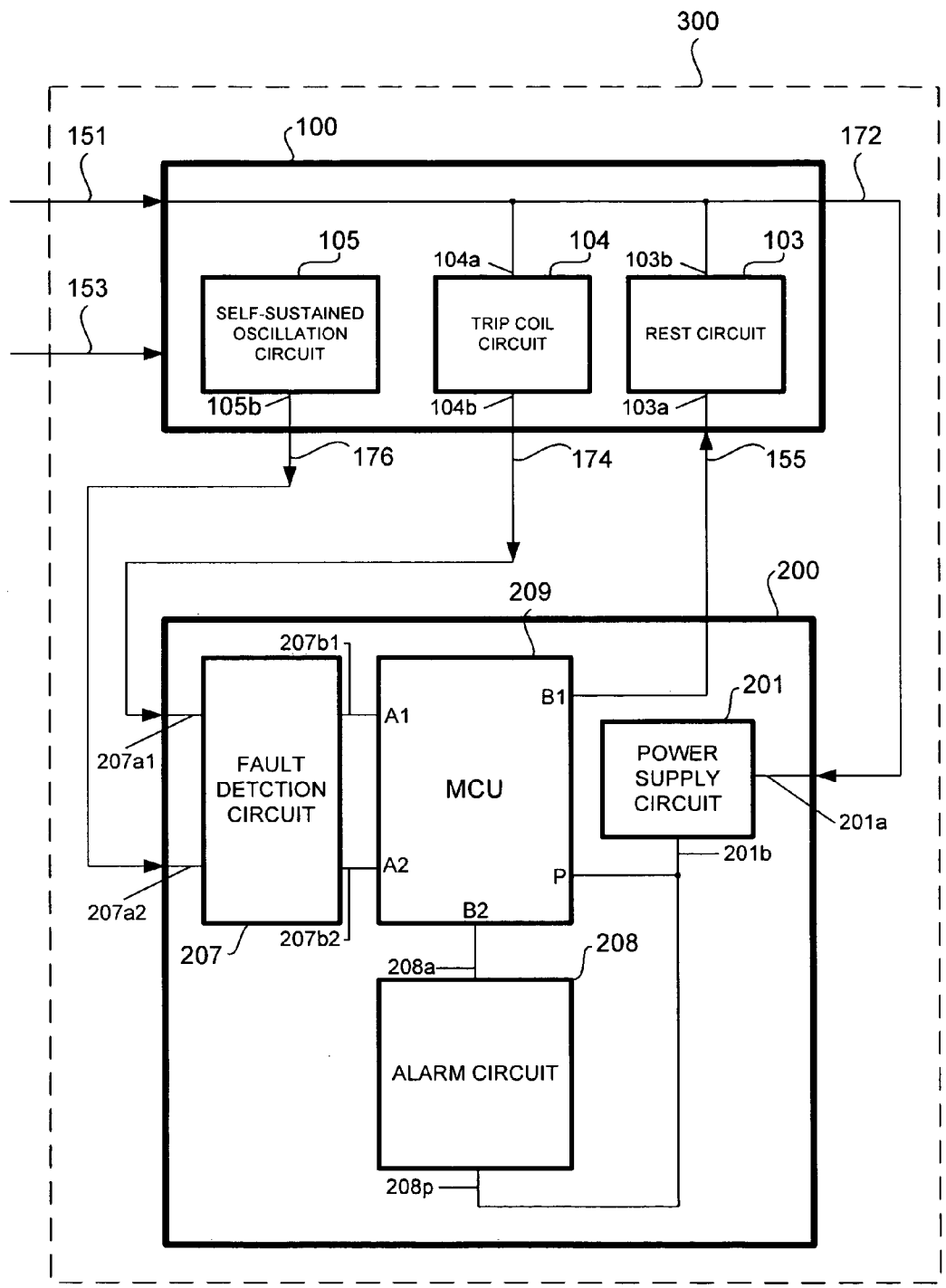
FIG. 1A shows one block diagram of a leakage current protection device with life testing capacity according to one embodiment of the present invention.

Prior to a detailed description of the present invention(s), the following definitions are provided as an aid to understanding the subject matter and terminology of aspects of the present invention(s), and not necessarily limiting of the present invention(s), which are expressed in the claims. Whether or not a term is capitalized is not considered definitive or limiting of the meaning of a term. As used in this document, a capitalized term shall have the same meaning as an uncapitalized term, unless the context of the usage specifically indicates that a more restrictive meaning for the capitalized term is intended. A capitalized term within the glossary usually indicates that the capitalized term has a separate definition within the glossary. However, the capitalization or lack thereof within the remainder of this document is not intended to be necessarily limiting unless the context clearly indicates that such limitation is intended. The terms "unit" and "circuit" are interchangeable.

A switching device usually can be in two states: a conductive state and a non-conductive state. When the switching device is in the conductive state, a current is allowed to pass through. When the switching device is in the non-conductive state, no current is allowed to pass through.

Definitions/Glossary

AC: alternate current

AFCI: arc fault circuit interrupter.

GFCI: ground fault circuit interrupter.

KHz: kilo-hertz.

LED: light emitting diode.

MCU: MicroController Unit.

SCR: silicon controlled rectifier.

Descriptions

A key switching component of a trip mechanism of a leakage current protection device is usually an SCR. When leakage current or arc fault occurs, the conduction of current through the SCR must be guaranteed. Otherwise, the trip coil circuit will be broken and the trip mechanism will fail to operate properly.

In order to check whether the trip coil conducts current, the trip coil is tested to determine if the trip coil conducts current once the current conducting condition is met. Experiments are conducted to show that the proper operation of the tripper depends not only on whether the trip coil conducts current, but also on other conditions such as the current level and the duration of current conduction. The current level must be strong enough and the duration of current conduction must be long enough. Since the trip coil and the SCR are electrically coupled to a 110 to 240V AC power source, the descending edge of the positive cycle of the AC power source is selected to turn on the SCR when the instant value exceeds a predetermined value. While the SCR is set in a conductive state, the leakage current detection circuit is tested to determine whether the current passes through the SCR. Immediately after the SCR is then turned on, the AC power source crosses zero volt level and enters the negative cycle, the SCR is turned off. Since the SCR is turned on only for a very brief time period, the current passing through the SCR is small enough to ensure the tripper is not tripped.

Figure 1B:
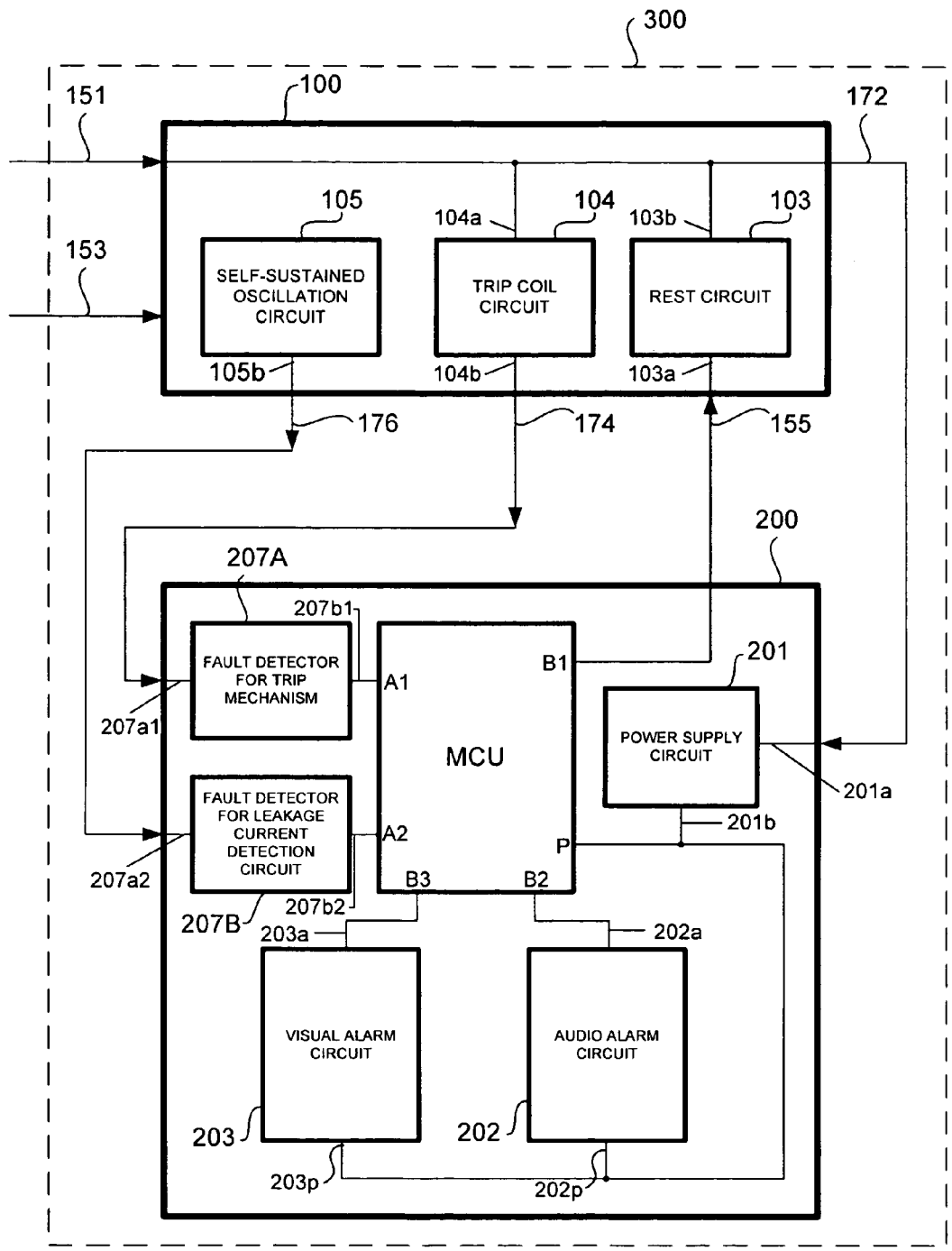
FIG. 1B shows a more detailed diagram of a leakage current protection device with life test according to another embodiment of the present invention.
Figure 2:
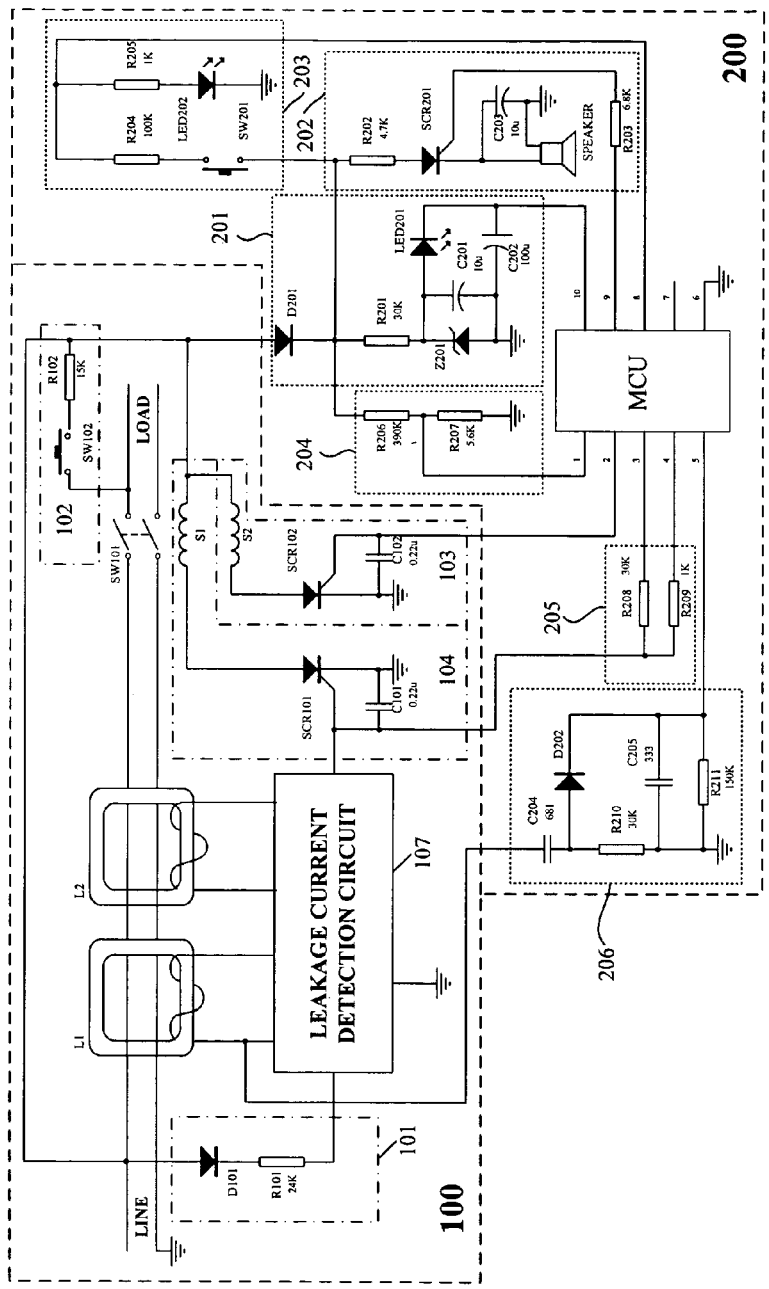
FIG. 2 shows a circuit diagram of apparatus for testing the life of a leakage current protection device according to one embodiment of the present invention.

Referring now to FIG. 1A, FIG. 1B and FIG. 2, respectively, a leakage current protection device 100 has a pair of input wires: a first input 151, a second input 153, also labeled as LINE in FIG. 2 for connecting the leakage current protection device 100 to an AC power source (not shown), and a pair of output wires for connecting the AC power source to a load (not shown), labeled as LOAD in FIG. 2, a switch SW101 controlled by a trip coil S1 and a reset coil S2, a reset circuit 103, a trip coil circuit 104, a half cycle power supply circuit 101, a manual testing circuit 102, a self-sustained oscillation circuit 105, and a leakage current detection circuit 107 with two leakage current sensing coils L1 and L2.

The leakage current protection device 100 also has a third input 155 that is electrically coupled to the reset circuit 103, a first output 172 that is electrically coupled to the AC power source, a second output 174 for sending out an oscillation signal that contains the intrinsic frequency characteristics of the leakage current detection circuit 107, a third output 176 for sending out another signal indicating whether the trip coil circuit 104 has a fault, a self-sustained oscillation circuit 105 that is electro-magnetically coupled therebetween the first input 151 and the second input 153, and electrically coupled to the third output 176.

The half cycle power supply circuit 101 has a rectifier diode D101 and a current limiting resistor R101 coupled in series. The half cycle power supply circuit 101 supplies a direct current power to the leakage current detection circuit 107.

The manual testing circuit 102 has a resistor R102 and a push-on release-off switch 102 coupled in series for manually testing the leakage current protection device.

The reset circuit 103 has an input 103a that is electrically coupled to the third input 155, and an output 103b that is electrically coupled to the first output 172. The reset circuit 103 further has a switching device SCR102, a capacitor C101 and a reset coil S2. The signal from the input 103a to the gate of the switching device SCR102 makes the switching device either SCR102 in a conductive state or a non-conductive state as set forth above. When the SCR102 is in a conductive state, the reset coil S2 is connected to the power supply and maintains the switch SW101 in a conductive state such that the AC power is connected from the LINE terminal to the LOAD terminal. When the SCR102 is in a non-conductive state, the power supply to the reset coil S2 is cut off so that the AC power is disconnected from the LINE terminal to the LOAD terminal as shown in FIG. 2.

The trip coil circuit 104 has an input 104a that is electrically coupled to the output 103b of the reset circuit 103 and the first output 172, and an output 104b that is electrically coupled to the second output 174. The trip coil circuit 104 has a switching device SCR101, a capacitor C101 and a trip coil S1. The input signal from the leakage current detection circuit 107 to the gate of the switching device SCR101 makes the switching device either in a conductive state or a non-conductive state. When the SCR101 is in the conductive state, the trip coil S1 is connected to the power supply and trips the switch SW101 into a non-conductive state (trip state). When the SCR101 is in a non-conductive state, the power supply to the trip coil S1 is cut off so that AC power is disconnected from the LINE terminal to the LOAD terminal.

The switch SW101 is responsive to the action of the trip coil S1 and the reset coil S2. The trip coil S1 is controlled by the trip coil circuit 104 to disconnect the AC power source to the load. The reset coil S2 is controlled by the reset circuit 103 to connect the AC power source to the load. When the leakage current detection circuit 107 detects a leakage current, the signal from the leakage current detection circuit 107 is supplied to the gate of the switching device SCR101 and sets the switching device SCR101 to a conductive state, which supplies power to energize the trip coil S1 to trip the switch SW101 to break the AC power connection from the LINE to the LOAD, i.e. in the switch SW101 is in a trip state. The reset circuit 103, on the other hand, energizes the reset coil S2 through the switching device SCR102 to reset the SW101 back to a normal conductive state to connect the AC power from the LINE to the LOAD.

The self-sustained oscillation circuit 105 has in one embodiment a capacitor C103, an inductor coil L2 connected in parallel to the capacitor C103. The circuit 105 is positioned in close proximity to the inductor coil L1 and L2 of the leakage current detection circuit 107. The circuit 105 is capable of generating a self-sustained oscillation signal with an intrinsic frequency that contains or represents the frequency characteristics of the leakage current detection circuit 107. The intrinsic frequency of the leakage current detection circuit 107 depends on the capacitance value of C103, the inductance values of L1 and L2. The amplitude of the self-sustained oscillation signal depends on the impedance of the leakage current detection circuit 107, as known to the people skilled in the art. If the components such as the coils L1 and L2 of the leakage current detection circuit 107 are working properly, the self-sustained oscillation circuit 105 is able to generate the self-sustained oscillation signal. Otherwise, the self-sustained oscillation circuit is unable to generate a desired self-sustained oscillation signal. Therefore, the existence of the self-sustained oscillation signal is an indication of whether at least one fault exists in the leakage current detection circuit 107.

An apparatus 200 for testing life of the leakage current protection device 100 in one embodiment has: (i) a microcontroller unit (MCU) 209 having a plurality of input/output pins, (ii) a fault detection circuit 207, (iii) an alarm circuit 208, and (iv) a power supply circuit 201, as shown in FIGS. 1A and 1B, respectively.

In one embodiment, the MCU has a general purpose integrated circuit with a timer function. In another embodiment, the MCU has an application specific integrated circuit such as a timer LM555. The MCU 209 has a first input A1, a second input A2, a first output B1 that is electrically coupled to the third input 155 of the leakage current protection device 100, a second output B2, and a power supply input P. In the embodiment shown in FIG. 2, the MCU 209 has 10 pins Pin1 through Pin10, which can be utilized as inputs/outputs.

The power supply circuit 201 has an input 201*a* that is electrically coupled to the first output 172 of the leakage current protection device 100, and an output 201*b* that is electrically coupled to the power supply input P of the MCU 209 and the alarm circuit 208. The power supply circuit 201 has a rectifying diode D201, a resistor R201, a regulator diode Z201, a first voltage stabilizing capacitor C201, a second voltage stabilizing capacitor C202, and a light emitting diode LED201. The anode of the diode D201 is connected to the hot wire of the AC power. The cathode terminal of the diode D201 is connected to a first end of the resistor R201. A second end of the resistor R201 is utilized as a terminal Vcc and provides a DC power supply voltage. The regulator diode Z201 and the first voltage stabilizing capacitors C201 form a voltage regulator to further regulate the voltage of the terminal Vcc. The light emitting diode LED201 and the capacitor C202 are used to regulate the power supply to an appropriate voltage for the MCU. The output of the power supply circuit 201 is connected to the power supply Pin10 of the MCU. The LED201 may also be used as an indication of the normal working condition of the leakage current protection device unit.

The fault detection circuit 207 has an first input 207*a*1 that is electrically coupled to the second output 174 of the leakage current protection device 100, a second input 207*a*2 that is electronically coupled to the third output 176 of the leakage current protection device 100, a first output 207*b*1 that is electrically coupled to the first input A1 of the MCU 209, and a second output 207*b*2 that is electrically coupled to the second input A2 of the MCU 209, respectively.

When the apparatus 200 is in operation, the fault detection circuit 207 receives at least one signal from the second output 174 and the third output 176 of the leakage current protection device 100. The apparatus 200 then generates at least one DC voltage corresponding to the at least one signal to be received by at least one of the first input A1 and second input A2 of the MCU 209. The MCU 209 compares the at least one DC voltage with a predetermined threshold value to determine whether a fault exists in the leakage current protection device 100. If at least one fault exists, the MCU 209 activates the alarm circuit 208 for generating an alarm.

In one embodiment, the fault detection circuit 207 has a first fault detector 207*b* electrically coupled to the self-sustained oscillation circuit 105. In another embodiment, the fault detection circuit 207 has a second fault detector 207*a* electrically coupled to the trip coil circuit 104. In yet another embodiment, the fault detection circuit 207 has both the first fault detector 207*b* and the second fault detector 207*a*.

Figure 4:
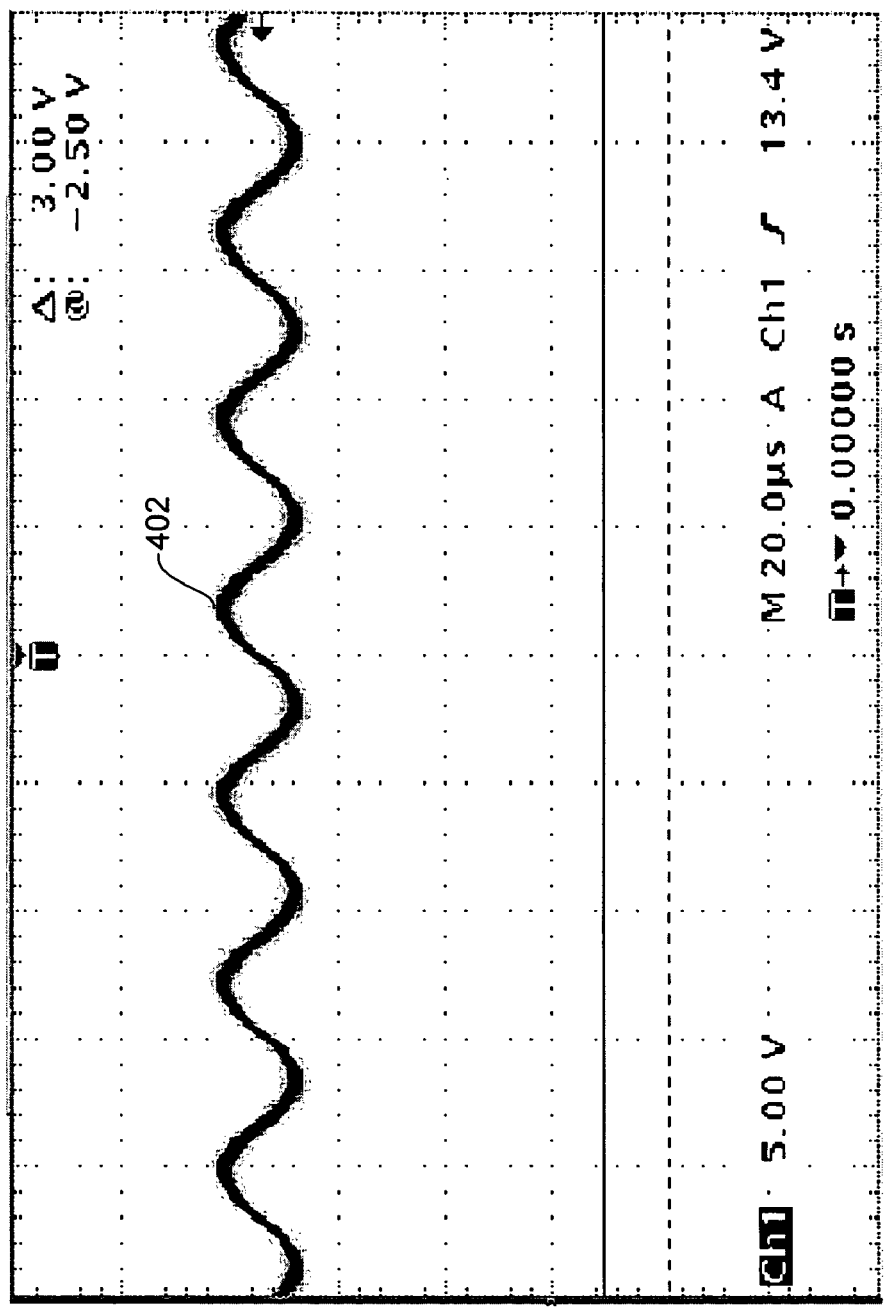
FIG. 4 shows signal wave form from a self-sustained oscillator when the leakage current detection circuit, which has inductive coils L1 and L2, is working properly, according to one embodiment of the present invention.

Referring now to FIGS. 2 and 4, the first fault detector 207*b* has a coupling and frequency selective processing circuit 206. The coupling and frequency selective processing circuit 206 receives an oscillation signal 402 as shown in FIG. 4, generated by the self-sustained oscillation circuit 105, filters the oscillation signal, converts the filtered oscillation signal into a second DC voltage, and provides the second DC voltage to the second input A2 of the MCU 209. The MCU 209 is programmed such that if the second DC voltage is greater than a second predetermined threshold value, no fault exists in the leakage current protection device 100, and if the second DC voltage is less than the second predetermined threshold value, at least one fault exists in the leakage current protection device 100.

The self-sustained oscillation signal is received by the coupling and frequency selective processing circuit 206. When L1 and L2 are working properly, an oscillation with a frequency between 2 KHz and 30 KHz occurs at the input of the coupling and frequency selective processing circuit 206 as shown in FIG. 4. The first capacitor C204 and the first resistor R210 form a filter to remove the high frequency portion of the signal. The signal passes through a waveform shaping circuit 206 having the diode D202, the second capacitor C205 and the second resistor R211 to produce a DC voltage. This DC voltage is provided to the second input of the MCU 209 for comparison. If this DC voltage is greater than a predetermined threshold, it indicates that the leakage current detection circuit 107 is working properly. If this DC voltage is smaller than the predetermined threshold or is zero, it indicates that at least one fault exists in the leakage current detection circuit 107.

Figure 3:
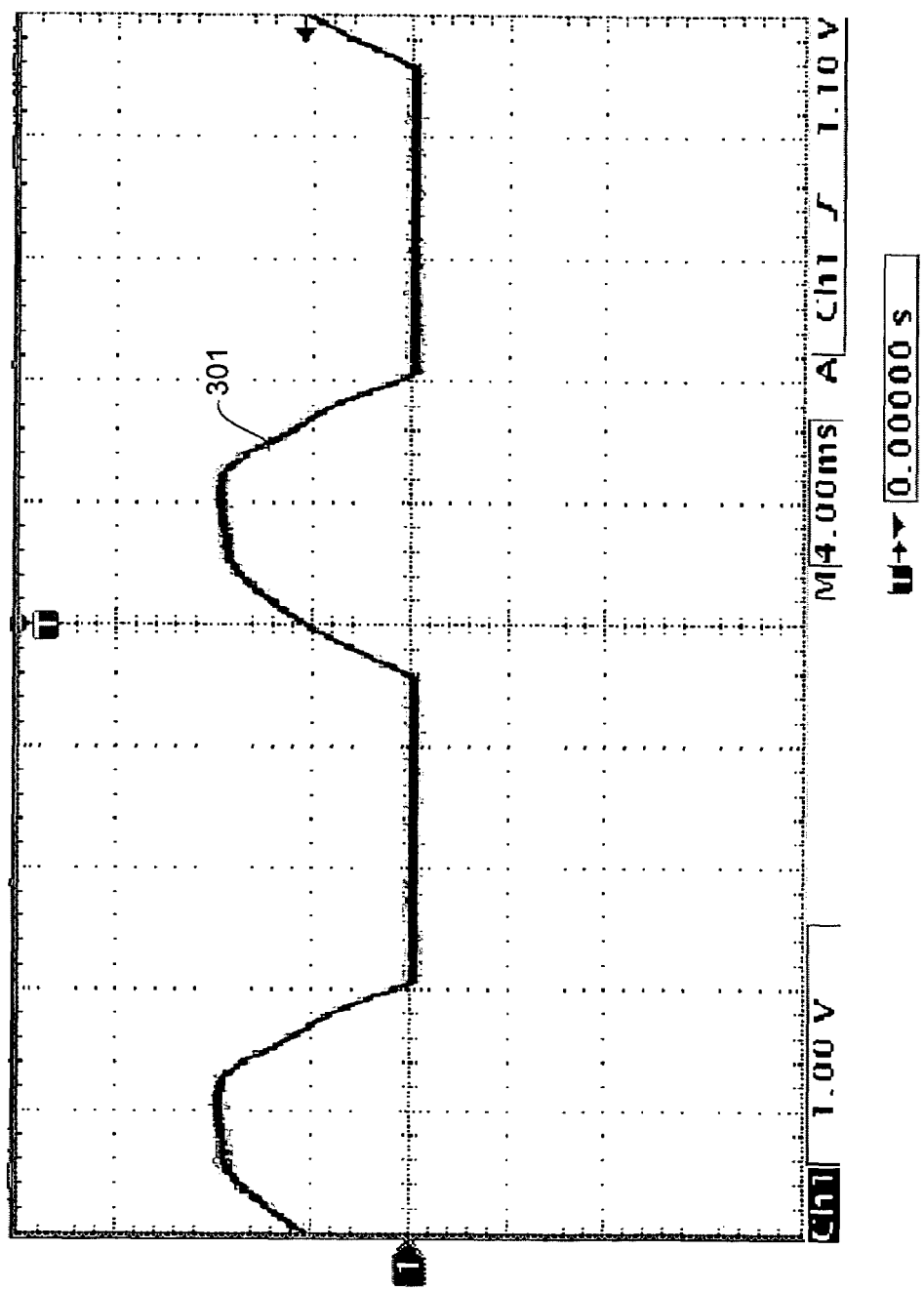
FIG. 3 shows a power grid synchronized half wave signal measured from a power grid synchronization monitoring circuit 204 as shown in FIG. 2, according to one embodiment of the present invention.

Referring now to FIGS. 2 and 3, in this embodiment, the second fault detector 207*a* has: (i) a power grid signal synchronization monitoring circuit 204, and (ii) a trip circuit detection circuit 205.

Figure 5:
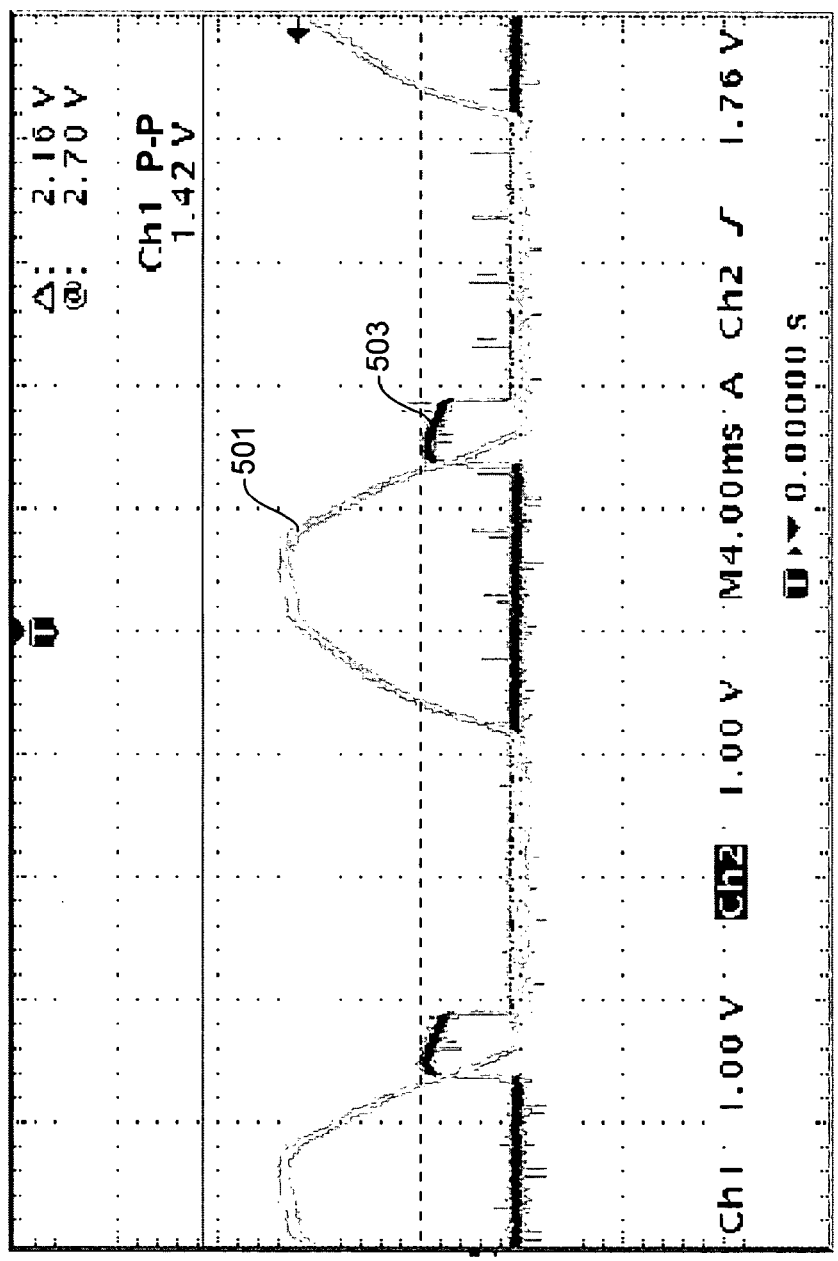
FIG. 5 shows the interaction between the output of the MCU and the gate of the trip SCR SCR102 as shown in FIG. 2, when the trip coil and the trip SCR are working properly, according to one embodiment of the present invention.

The power grid signal synchronization monitoring circuit 204 has a voltage divider having a first resistor R206 and a second resistor R207. The input to this circuit is the direct current power supply from the cathode of the diode D201. The first resistor R206 and the second resistor R207 form a voltage divider to regulate or reduce the DC voltage to an appropriate voltage to an input of the MCU. The power grid signal synchronization monitoring circuit 204 samples the power grid synchronization signal. Since the input to the power grid signal synchronization monitoring circuit 204 is connected to the power grid through a diode D201, the output of the power grid signal synchronization monitoring circuit 204 shows only the positive half of the power grid waveform, shown as waveform signal 301 in FIG. 3. This positive half of the power grid waveform passes through a voltage divider having a first resistor R206, and a second resistor R207, so that the output voltage of the power grid synchronization monitoring circuit 204 reaches an appropriate level. The sampling signal of the synchronized signal is connected to the input Pin1 of the MCU. When the descending edge of the waveform of the sampling signal of the synchronized signal reaches a predetermined threshold, the output Pin4 of the MCU sends out a short pulse 503 as shown in FIG. 5, when the trip mechanism is working properly.

The short pulse 503 is very short in terms of time duration, but it is long enough to set SCR101 in a conductive state to allow a current to pass through. While SCR101 is in a conductive state, the trip circuit detection unit 205 detects a first DC voltage established across the capacitor C101 at the gate of SCR101, i.e., the voltage across the gate and cathode of SCR101, to determine whether at least one fault exists in the trip mechanism. The first DC voltage across a p-n junction is about 0.7v for a silicon type SCR. The first DC voltage across a p-n junction is about 0.3v for a Germanium type SCR. This voltage is detected by the Pin3 of the MCU through the resistor R208 of the trip circuit detection unit 205 and is used to determine whether at least one fault exists in the trip mechanism. For example, if the trip coil S1 is broken, the trip coil S1 is unable to pass current from the AC power from the LINE terminal. Therefore, the voltage between the gate and the cathode of the switching device SCR101 is very small or substantially equals to zero. If this DC voltage is smaller than the predetermined threshold value which can be chosen for example as 0.1v or is zero, it indicates that at least one fault exists in the leakage current protection device 100. Referring now back to FIGS. 1A, 1B and 2, the MCU 209 sends an alarm signal to the alarm circuit 208 when the MCU 209 determines that at least one fault exists in the leakage current protection device 100, and the alarm circuit 208 receives the alarm signal and generates an alarm. The alarm circuit 208 has an input 208a that is electrically coupled to the second output B2 of the MCU 209, and a power supply input 208p. In one embodiment, the alarm unit includes an audio alarm circuit 202. In another embodiment, the alarm unit includes a visual alarm circuit 203. In yet another embodiment, the alarm unit has both the audio alarm circuit 202 and the visual alarm circuit 203.

The audio alarm circuit 202 has a speaker, a switching device SCR201, and voltage dividing resistor R202. A transistor or an SCR may be used as the switching device depending on the applications. A DC voltage from the power supply input 208p is applied to the speaker through the voltage dividing resistor R202 and the switching device SCR201. Normally, the switching device SCR201 is in a non-conductive state and the speaker remains silent. When an output from Pin9 of the MCU connected to the gate of the switching device SCR201 turns the switching device SCR201 to a conductive state, the speaker produces an audible alarm. An optional integrated circuit may be used to generate special alarm sounds.

The visual alarm circuit 203 in one embodiment has a resistor R203, a light emitting diode LED202, a switch SW201 and a resistor R204. Normally, the output Pin8 of the MCU is in low voltage state and the LED202 is not lit. When the MCU detects a fault in the leakage current protection device 100, the output of the Pin8 of the MCU turns to high voltage state and the voltage produces a visible alarm by lighting up the LED202 through the resistor R203. The switch SW201 is a mechanical contact switch associated with the trip protection devices. When the leakage current protection device 100 trips, the SW201 is set in a conductive state, causing the lighting of the LED202. The lighting of the LED202 indicates either the leakage current protection device unit is in a trip condition or the leakage current detection circuit is not working properly.

In another aspect, the present invention relates to a method for testing the life of a leakage current protection device 100 as described above. In one embodiment, the method includes the steps of:

providing a testing device 200 having a microcontroller unit (MCU) 209 having a first input, a second input, a first output and a second output, a fault detection circuit 207, an alarm circuit 208, and a power supply circuit 201;

processing at least one signal from a second output and a third output 176 of the leakage current protection device 100 and providing at least one DC voltage to be received at least one of the first input and the second input of the MCU 209;

comparing the value of the DC voltage to a predetermined threshold value by the MCU 209 to determine whether a fault exists in the leakage current protection device 100, wherein the MCU 209 is programmed such that if the DC voltage is greater than the predetermined threshold value, no fault exists in the leakage current protection device 100, and if the DC voltage is less than the predetermined threshold value, a fault exists in the leakage current protection device 100; and activating the alarm circuit 208 by the MCU 209 if a fault exists in the leakage current protection device 100 to generate an alarm to alert users of the leakage current protection device 100.

In one embodiment, the processing signal step may include the steps of:

receiving a oscillation signal generated by a self-sustained oscillation circuit 105, wherein the self-sustained oscillation signal reflects the intrinsic frequency characteristics of the leakage current detection circuit 100;

filtering the oscillation signal by a coupling and frequency selective processing circuit 206;

converting the filtered oscillation signal into a first DC voltage; and providing the second DC voltage to the second input A2 of the MCU 209.

In one embodiment, the processing signal step may include the steps of:

generating a series of pulse signal that is synchronized with an AC power source grid by a power grid signal synchronization monitoring circuit 204;

receiving and sending the series of pulse signal to a switching device SCR101 which has an anode, a cathode and a gate, by a trip circuit detection circuit 205;

setting the switching device SCR101 in a conductive state during the period when the voltage of the pulse signal is high;

detecting a second DC voltage across the gate and the cathode of the switching device SCR101, while the switching device SCR101 is in a conductive state; and providing the second DC voltage to the first input A2 of the MCU 209.

In one embodiment, the activating the alarm circuit 208 step further has at least of one of following steps:

activating an audio alarm circuit 202 for generating an audible alarm; and activating a visual alarm circuit 203 for generating a visible alarm.

The above features as well as additional features and aspects of the present invention are disclosed herein and will become apparent from the foregoing description of preferred embodiments of the present invention.

While there has been shown several and alternate embodiments of the present invention, it is to be understood that certain changes can be made as would be known to one skilled in the art without departing from the underlying scope of the present invention as is discussed and set forth above and below including claims. Furthermore, the embodiments described above and claims set forth below are only intended to illustrate the principles of the present invention and are not intended to limit the scope of the present invention to the disclosed elements.

What is claimed is:

1. An apparatus for testing the life of a leakage current protection device, wherein the leakage current protection device has a first input, a second input, a third input, a first output, a second output, a third output, a self-sustained oscillation circuit that is electro-magnetically coupled therebetween the first input and the second input, and electrically coupled to the third output, a reset circuit with an input that is electrically coupled to the third input, and an output that is electrically coupled to the first output, and a trip coil circuit with an input that is electrically coupled to the output of the reset circuit and the first output, and an output that is electrically coupled to the second output, comprising:
   (i) a microcontroller unit (MCU) having a first input, a second input, a first output that is electrically coupled to the third input of the leakage current protection device, a second output, and a power supply input;
   (ii) a fault detection circuit having an first input that is electrically coupled to the second output of the leakage current protection device, a second input that is electronically coupled to the third output of the leakage current protection device, a first output that is electrically coupled to the first input of the MCU, and a second output that is electrically coupled to the second input of the MCU, respectively;
   (iii) an alarm circuit having an input that is electrically coupled to the second output of the MCU, and a power supply input; and
   (iv) a power supply circuit having an input that is electrically coupled to the first output of the leakage current protection device, and an output that is electrically coupled to the power supply input of the MCU and the power supply input of the alarm circuit,
wherein, in operation, the fault detection circuit receives at least one signal from the second output and the third output of the leakage current protection device, and generates at least one DC voltage corresponding to the at least one signal to be received by at least one of the first input and second input of the MCU, and the MCU compares the at least one DC voltage with a predetermined threshold value to determine whether a fault exists in the leakage current protection device, and activates the alarm circuit if at least one fault exists.

2. The apparatus of claim 1, wherein the fault detection circuit comprises at least one of a first fault detector electrically coupled to the self-sustained oscillation circuit and a second fault detector electrically coupled to the trip coil circuit.

3. The apparatus of claim 2, wherein the first fault detector comprises a coupling and frequency selective processing circuit adapted for receiving an oscillation signal generated by the self-sustained oscillation circuit, filtering the oscillation signal, converting the filtered oscillation signal into a first DC voltage, and providing the first DC voltage to the second input of the MCU.

4. The apparatus of claim 3, wherein the MCU is programmed such that if the first DC voltage is greater than a first predetermined threshold value, no fault exists in the leakage current protection device, and if the first DC voltage is less than the first predetermined threshold value, at least one fault exists in the leakage current protection device.

5. The apparatus of claim 2, wherein the second fault detector comprises:
   (i) a power grid signal synchronization monitoring circuit adapted for generating a series of pulse signal that is synchronized with an AC power source grid; and
   (ii) a trip circuit detection circuit adapted for receiving and sending the series of pulse signal to a switching device, which has an anode, a gate, and a cathode, to set the switching device into a conductive state during the period when the voltage of the pulse signal is high, detecting a second DC voltage between the gate and the cathode of the switching device while the switching device is in the conductive state, and providing the second DC voltage to the first input of the MCU.

6. The apparatus of claim 5, wherein the MCU is programmed such that if the second DC voltage is greater than a second predetermined threshold value, no fault exists in the trip coil circuit of the leakage current protection device, and if the second DC voltage is less than the second predetermined threshold value, at least one fault exists in the leakage current protection device.

7. The apparatus of claim 1, wherein the MCU sends an alarm signal to the alarm circuit when the MCU determines that at least one fault exists, and the alarm circuit receives the alarm signal and generates an alarm.

8. The apparatus of claim 7, wherein the alarm circuit comprises at least one of an audio alarm circuit for generating an audible alarm and a visual alarm circuit for generating a visible alarm.

9. A method for testing the life of a leakage current protection device, wherein the leakage current protection device has a first input, a second input, a third input, a first output, a second output, a third output, a self-sustained oscillation circuit that is electro-magnetically coupled therebetween the first input and the second input, and electrically coupled to the third output, a reset circuit with an input that is electrically coupled to the third input, and an output that is electrically coupled to the first output, and a trip coil circuit with an input that is electrically coupled to the output of the reset circuit and the first output, and an output that is electrically coupled to the second output, comprising the steps of:
   (i) providing a testing device having:
      (A) a microcontroller unit (MCU) having a first input, a second input, a first output that is electrically coupled to the third input of the leakage current protection device, a second output, and a power supply input;
      (B) a fault detection circuit having an first input that is electrically coupled to the second output of the leakage current protection device, a second input that is electronically coupled to the third output of the leakage current protection device, a first output that is electrically coupled to the first input of the MCU, and a second output that is electrically coupled to the second input of the MCU, respectively;
      (C) an alarm circuit having an input that is electrically coupled to the second output of the MCU, and a power supply input; and
      (D) a power supply circuit having an input that is electrically coupled to the first output of the leakage current protection device, and an output that is electrically coupled to the power supply input of the MCU and the alarm circuit,
   (ii) processing at least one signal from the second output and the third output of the leakage current protection device and providing at least one DC voltage to be received at least one of the first input and the second input of the MCU;

(iii) comparing the value of the DC voltage to a predetermined threshold value by the MCU to determine whether a fault exists in the leakage current protection device, wherein the MCU is programmed such that if the DC voltage is greater than the predetermined threshold value, no fault exists in the leakage current protection device, and if the DC voltage is less than the predetermined threshold value, a fault exists in the leakage current protection device; and (iv) activating the alarm circuit by the MCU if a fault exists in the leakage current protection device to generate an alarm to alert users of the leakage current protection device.

10. The method of claim 9, wherein the processing signal step further comprising the steps of:

(i) receiving a oscillation signal generated by a self-sustained oscillation circuit, wherein the self-sustained oscillation signal reflects the intrinsic frequency characteristics of the leakage current detection circuit;

(ii) filtering the oscillation signal by a coupling and frequency selective processing circuit;

(iii) converting the filtered oscillation signal into a first DC voltage; and (iv) providing the first DC voltage to the second input of the MCU.

11. The method of claim 9, wherein the processing signal step further comprising the steps of:

(i) generating a series of pulse signal that is synchronized with an AC power source grid by a power grid signal synchronization monitoring circuit;

(ii) receiving and sending the series of pulse signal to a switching device which has a anode, a cathode and a gate, by a trip circuit detection circuit;

(iii) setting the switching device in a conductive state during the period when the voltage of the pulse signal is high;

(iv) detecting a second DC voltage across the gate and the cathode of the switching device, while the switching device is in a conductive state; and (v) providing the second DC voltage to the first input of the MCU.

12. The method of claim 9, wherein the activating the alarm circuit step further comprising at least of one of following steps:

(i) activating an audio alarm circuit for generating an audible alarm; and (ii) activating a visual alarm circuit for generating a visible alarm.

13. An leakage current protection device with life testing, comprising:

(i) a leakage current protection device having:

(A) a first input;
(B) a second input;
(C) a third input;
(D) a first output;
(E) a second output;
(F) a third output;
(G) a self-sustained oscillation circuit that is electromagnetically coupled therebetween the first input and the second input, and electrically coupled to the third output;
(H) a reset circuit with an input that is electrically coupled to the third input, and an output that is electrically coupled to the first output; and (I) a trip coil circuit with an input that is electrically coupled to the output of the reset circuit and the first output, and an output that is electrically coupled to the second output;

(ii) a microcontroller unit (MCU) having a first input, a second input, a first output that is electrically coupled to the third input of the leakage current protection device, a second output, and a power supply input;

(iii) a fault detection circuit having an first input that is electrically coupled to the second output of the leakage current protection device, a second input that is electronically coupled to the third output of the leakage current protection device, a first output that is electrically coupled to the first input of the MCU, and a second output that is electrically coupled to the second input of the MCU, respectively;

(iv) an alarm circuit having an input that is electrically coupled to the second output of the MCU, and a power supply input; and (v) a power supply circuit having an input that is electrically coupled to the first output of the leakage current protection device, and an output that is electrically coupled to the power supply input of the MCU and the alarm circuit, wherein, in operation, the fault detection circuit receives at least one signal from the second output and the third output of the leakage current protection device, and generates at least one DC voltage corresponding to the at least one signal to be received by at least one of the first input and second input of the MCU, and the MCU compares the at least one DC voltage with a predetermined threshold value to determine whether a fault exists in the leakage current protection device, and activates the alarm circuit if at least one fault exists.

14. The apparatus of claim 13, wherein the fault detection circuit comprises at least one of a first fault detector electrically coupled to the self-sustained oscillation circuit and a second fault detector electrically coupled to the trip coil circuit.

15. The apparatus of claim 14, wherein the first fault detector comprises a coupling and frequency selective processing circuit adapted for receiving an oscillation signal generated by the self-sustained oscillation circuit, filtering the oscillation signal, converting the filtered oscillation signal into a first DC voltage, and providing the first DC voltage to the second input of the MCU.

16. The apparatus of claim 15, wherein the MCU is programmed such that if the first DC voltage is greater than a first predetermined threshold value, no fault exists in the leakage current protection device, and if the first DC voltage is less than the first predetermined threshold value, at least one fault exists in the leakage current protection device.

17. The apparatus of claim 14, wherein the second fault detector comprises:

(i) a power grid signal synchronization monitoring circuit adapted for generating a series of pulse signal that is synchronized with an AC power source grid; and (ii) a trip circuit detection circuit adapted for receiving and sending the series of pulse signal to a switching device, which has an anode, a gate, and a cathode, to set the switching device into a conductive state during the period when the voltage of the pulse signal is high, detecting a second DC voltage between the gate and the cathode of the switching device while the switching device is in the conductive state, and providing the second DC voltage to the first input of the MCU.

18. The apparatus of claim 17, wherein the MCU is programmed such that if the second DC voltage is greater than a second predetermined threshold value, no fault exists in the trip coil circuit of the leakage current protection device, and if the second DC voltage is less than the second predetermined threshold value, at least one fault exists in the leakage current protection device.

19. The apparatus of claim 13, wherein the MCU sends an alarm signal to the alarm circuit when the MCU determines that at least one fault exists, and the alarm circuit receives the alarm signal and generates an alarm.

20. The apparatus of claim 19, wherein the alarm circuit comprises at least one of an audio alarm circuit for generating an audible alarm and a visual alarm circuit for generating a visible alarm.

* * * * *